(12) United States Patent
Lee et al.

(10) Patent No.: US 11,526,136 B2
(45) Date of Patent: Dec. 13, 2022

(54) TIME-TO-DIGITAL CONVERSION CIRCUIT AND SOURCE DRIVER INCLUDING THE SAME

(71) Applicant: Silicon Works Co., Ltd., Daejeon (KR)

(72) Inventors: Jong Suk Lee, Daejeon (KR); Young Bok Kim, Daejeon (KR); Chung Hwan Son, Daejeon (KR); Seok Jae Oh, Daejeon (KR); Yeh Ju Ka, Daejeon (KR)

(73) Assignee: LX Semicon Co, Ltd, Daejeon (KR)

( * ) Notice: Subject to any disclaimer, the term of this patent is extended or adjusted under 35 U.S.C. 154(b) by 0 days.

(21) Appl. No.: 17/443,799

(22) Filed: Jul. 27, 2021

(65) Prior Publication Data

US 2022/0026856 A1 Jan. 27, 2022

(30) Foreign Application Priority Data

Jul. 27, 2020 (KR) .................... 10-2020-0093025
Jul. 23, 2021 (KR) .................... 10-2021-0097311

(51) Int. Cl.
*G04F 10/00* (2006.01)
*H03L 7/085* (2006.01)
*H03L 7/099* (2006.01)

(52) U.S. Cl.
CPC ............ *G04F 10/005* (2013.01); *H03L 7/085* (2013.01); *H03L 7/0992* (2013.01); *H03L 2207/50* (2013.01)

(58) Field of Classification Search
CPC ........ G04F 10/00; G04F 10/005; G04F 10/04; G04F 10/06; G04F 10/10; G04F 10/105
See application file for complete search history.

(56) References Cited

U.S. PATENT DOCUMENTS 10,606,217 B2 * 3/2020 Kim .................. H03L 7/1974

FOREIGN PATENT DOCUMENTS

KR 2010-0133488 A 12/2010
KR 2018-006010 A1 7/2019

* cited by examiner

*Primary Examiner* — Diana J. Cheng
(74) *Attorney, Agent, or Firm* — Polsinelli PC

(57) ABSTRACT

The present disclosure discloses a time-to-digital conversion circuit for a clock and data recovery circuit. The time-to-digital conversion circuit may include a first time-to-digital conversion circuit enabled when a phase difference between a clock of an input signal and a recovery clock signal is greater than a reference phase difference and configured to output a first digital signal corresponding to the phase difference, and a second time-to-digital conversion circuit enabled when the phase difference is equal to or smaller than the reference phase difference and configured to output a second digital signal corresponding to the phase difference.

18 Claims, 8 Drawing Sheets

TIME-TO-DIGITAL CONVERSION CIRCUIT AND SOURCE DRIVER INCLUDING THE SAME

BACKGROUND

1. Technical Field

The present disclosure relates to a display apparatus, and more particularly, to a time-to-digital conversion circuit supporting the easy recovery of a clock and data in a high-speed operation and a source driver including the same.

2. Related Art

In general, a display apparatus may include a display panel, a source driver, a timing controller, etc.

The source driver converts image data, provided by the timing controller, into a data voltage and provides the data voltage to the display panel. The source driver may be integrated in the form of a chip, and may be configured in plural in the display panel by considering the size and resolution of a screen.

The source driver may include a clock and data recovery circuit for recovering a clock signal and data. The clock and data recovery circuit is for receiving, from the timing controller, an input signal in which a clock has been embedded in data and recovering a clock signal and data from the input signal.

A common clock and data recovery circuit may include a bang-bang phase detector, and may control the phase of a clock signal by using the bang-bang phase detector.

However, if the common clock and data recovery circuit recovers data transmitted at a high speed, a jitter characteristic of the bang-bang phase detector may deteriorate. Furthermore, the common clock and data recovery circuit has problems in that the circuit is complicated due to the mixture of a digital circuit and an analog circuit and a chip area is increased due to a passive element.

SUMMARY

Various embodiments are directed to providing a time-to-digital conversion circuit supporting the easy recovery of a clock signal and data in a high-speed operation and a source driver including the same.

In an embodiment, a time-to-digital conversion circuit may include a first time-to-digital conversion circuit enabled when a first phase difference between a clock of an input signal and a recovery clock signal is greater than a reference phase difference and configured to output a first digital signal corresponding to the first phase difference, and a second time-to-digital conversion circuit enabled when the phase difference is equal to or smaller than the reference phase difference and configured to output a second digital signal corresponding to the phase difference.

In an embodiment, a source driver may include a clock and data recovery circuit configured to generate a recovery clock signal and recovery data from an input signal by using a time-to-digital conversion circuit, and a data driving circuit configured to convert the recovery data into a data voltage and provide the data voltage to a display panel. The time-to-digital conversion circuit may include a first time-to-digital conversion circuit enabled when a first phase difference between a clock of the input signal and the recovery clock signal is greater than a reference phase difference and configured to output a first digital signal corresponding to the first phase difference, and a second time-to-digital conversion circuit enabled when the first phase difference is equal to or smaller than the reference phase difference and configured to output a second digital signal corresponding to the first phase difference.

According to embodiments, a clock signal and data can be easily recovered even in an operation of recovering data transmitted at a high speed because the time-to-digital conversion circuit capable of comparing a clock of an input signal and a recovery clock signal is used.

Furthermore, according to embodiments, a circuit for recovering a clock signal and data is implemented using a digital circuit. Therefore, the configuration thereof can be simplified and scalability for a process change can be facilitated.

Furthermore, according to embodiments, a clock embedded in data can be easily recovered because a clock of an input signal and a recovery clock signal can be compared although a location of the clock is changed depending on a protocol of the input signal.

DETAILED DESCRIPTION

Figure 1:
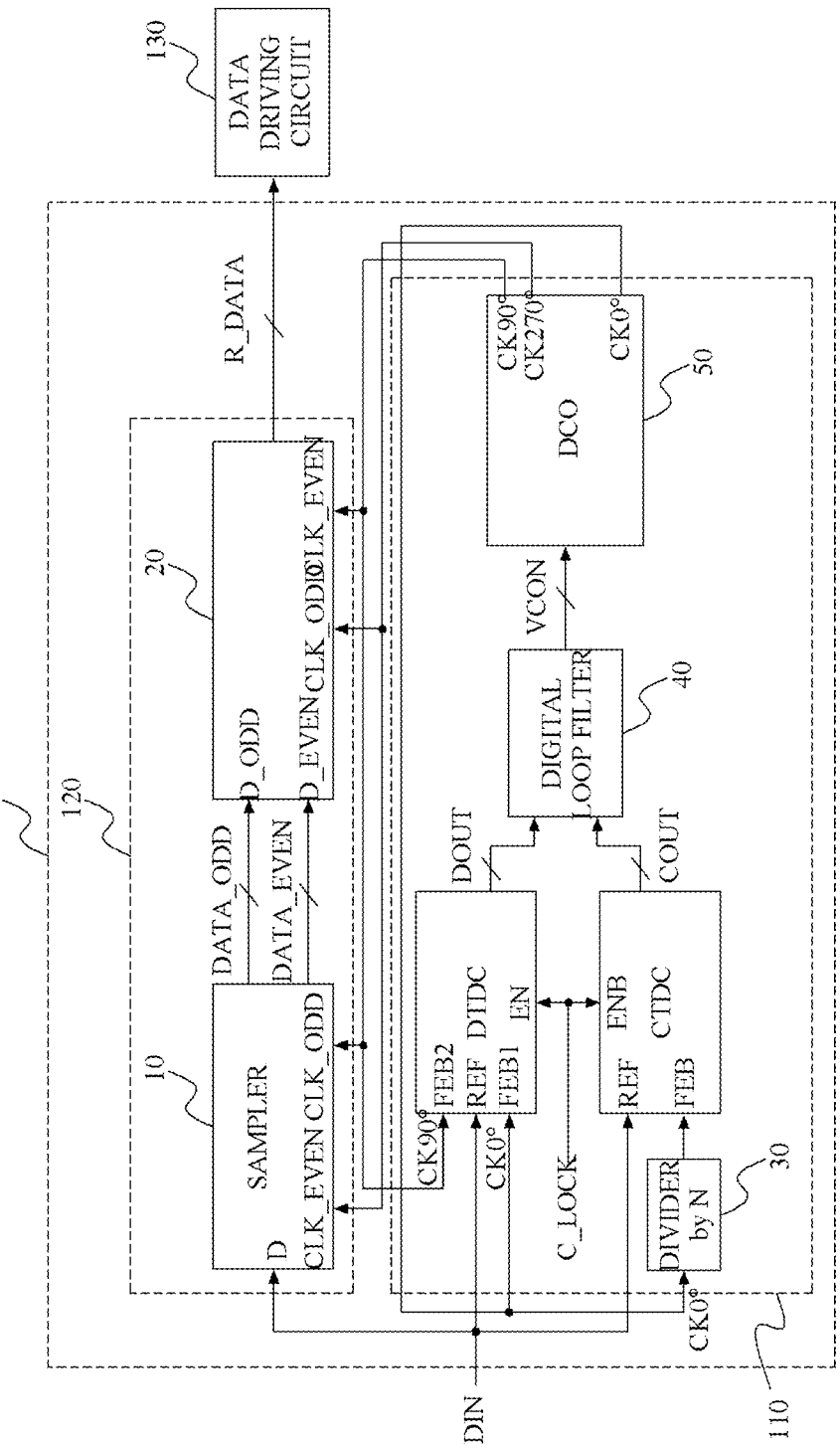
FIG. 1 is a block diagram of a clock and data recovery circuit according to an embodiment.

Embodiments may provide a clock and data recovery circuit capable of easily recovering a clock and data in a high-speed operation, and a source driver including the same.

Embodiments may provide a time-to-digital conversion circuit for a clock and data recovery circuit, and a source driver including the same.

An input signal is provided to have a clock training pattern in the early stage of an operation and then to have data in which a clock has been embedded. The clock training pattern means a clock pattern including a clock for recovery. The input signal having the clock training pattern may be provided to stabilize a clock signal in a clock training period set in the early stage of an operation, etc.

In embodiments, it may be understood that the clock and data recovery circuit may receive an input signal having a clock training pattern in the early stage of an operation, and the clock and data recovery circuit compares a recovery clock signal and a clock of the input signal and receives the input signal having data in which a clock has been embedded after a coarse lock stabilized within a preset range. Image data and control data may be included in the data.

The coarse lock may be enabled when a time difference between a clock of an input signal and a recovery clock signal is equal to or smaller than a reference time, and may be disabled when the time difference between the clock of the input signal and the recovery clock signal is greater than the reference time. In this case, the recovery clock signal may be defined as a clock signal recovered using the clock of the input signal.

As described above, the time difference means a phase difference between a clock of the input signal and the recovery clock signal. Hereinafter, it may be understood that a phase difference corresponds to the time difference. A reference time difference may be understood as a reference phase difference. For example, assuming that one cycle of a recovery clock signal includes two unit intervals (2 UI) and the duty ratio of the recovery clock signal is 50:50, in an embodiment of the present disclosure, the reference phase difference may be set to 0.5 UI. It may be understood that the reference phase difference of 0.5 UI corresponds to a phase difference of 90°.

Furthermore, it may be understood that the coarse lock is enabled when a phase difference between a clock of an input signal and a recovery clock signal is equal to or smaller than the reference phase difference of 0.5 UI, and is disabled when the phase difference between the clock of the input signal and the recovery clock signal is greater than the reference phase difference of 0.5 UI.

In embodiments, a coarse loop may be defined to align a clock of an input signal and a recovery clock signal so that the clock of the input signal and the recovery clock signal have a phase difference within a reference phase difference when the phase difference is greater than the reference phase difference.

In embodiments, a fine loop may be defined to align a clock of an input signal and a recovery clock signal so that the clock of the input signal and the recovery clock signal have a more reduced phase difference within a reference phase difference when the phase difference is equal to or smaller than the reference phase difference.

In embodiments, terms, such as a first and a second, may be used to distinguish between various elements. The elements are not limited by terms, such as a first and a second.

FIG. 1 is a block diagram of a clock and data recovery circuit 100 according to an embodiment.

The clock and data recovery circuit 100 may include a clock recovery unit 110 and a data recovery unit 120.

The clock recovery unit 110 is configured to perform first time-to-digital conversion or second time-to-digital conversion on a phase difference between a clock of an input signal DIN and a recovery clock signal depending on whether the phase difference is greater than a preset reference phase difference.

Furthermore, the clock recovery unit 110 is configured to output a recovery clock signal, a first clock signal and a second clock signal corresponding to the first time-to-digital conversion or the second time-to-digital conversion. In this case, it is preferred that a phase difference between the first clock signal and the recovery clock signal is different from that between the second clock signal and the recovery clock signal.

Furthermore, the data recovery unit 120 is configured to sample data from the input signal DIN by using the first clock signal and the second clock signal and to output recovered data R_DATA.

The clock recovery unit 110 may receive the input signal DIN, and may generate a recovery clock signal corresponding to a phase of the clock of the input signal DIN, the first clock signal having a phase difference of 0.5 UI from the recovery clock signal, and the second clock signal having a phase difference of 1.5 UI from the recovery clock signal. For a description of an embodiment, the recovery clock signal is indicated as CK0°, the first clock signal is indicated as CK90°, and the second clock signal is indicated as CK270°.

The clock recovery unit 110 may include a first time-to-digital conversion circuit CTDC for the first time-to-digital conversion and a second time-to-digital conversion circuit DTDC for the second time-to-digital conversion. The first time-to-digital conversion circuit CTDC and the second time-to-digital conversion circuit DTDC may operate so that the first time-to-digital conversion circuit CTDC and the second time-to-digital conversion circuit DTDC are alternately enabled and disabled in response to a coarse lock signal C_LOCK.

For example, a level of the coarse lock signal C_LOCK may transition to a low logic level for coarse lock disabling when a phase difference between a clock of the input signal DIN and a recovery clock signal is greater than the reference phase difference of 0.5 UI. In this case, the first time-to-digital conversion circuit CTDC is enabled, and the second time-to-digital conversion circuit DTDC is disabled.

Furthermore, a level of the coarse lock signal C_LOCK may shift to a high logic level for coarse lock enabling when a phase difference between a clock of the input signal DIN and a recovery clock signal is equal to or smaller than the reference phase difference of 0.5 UI. In this case, the first time-to-digital conversion circuit CTDC is disabled, and the second time-to-digital conversion circuit DTDC is enabled.

The clock recovery unit 110 may output the recovery clock signal CK0°, the first clock signal CK90° and the second clock signal CK270° having oscillation frequencies and phases controlled by using a first digital signal COUT of the first time-to-digital conversion circuit CTDC or a second digital signal DOUT of the second time-to-digital conversion circuit DTDC.

In this case, the recovery clock signal CK0° may be fed back to the first time-to-digital conversion circuit CTDC and the second time-to-digital conversion circuit DTDC. Furthermore, the first clock signal CK90° may be fed back to the second time-to-digital conversion circuit DTDC. The fed-back recovery clock signal CK0° and the fed-back first clock signal CK90° may be used to align the phases of a clock of the input signal DIN and the recovery clock signal CK0°.

The first clock signal CK90° and the second clock signal CK270° may be provided to the data recovery unit 120, and may be used to recover data from the input signal DIN.

The clock recovery unit 110 may include the first time-to-digital conversion circuit CTDC, the second time-to-digital conversion circuit DTDC, a digital loop filter 40, a digitally controlled oscillator 50 and a clock divider 30.

The first time-to-digital conversion circuit CTDC may receive the input signal DIN from a timing controller, and may output the first digital signal COUT corresponding to a phase difference between a clock of the input signal DIN and a recovery clock signal. The timing controller may transmit the input signal DIN including a clock training pattern in the early stage of an operation.

The first time-to-digital conversion circuit CTDC may be used as a coarse loop for aligning a clock of the input signal DIN and the recovery clock signal CK0° when a phase difference between the clock of the input signal DIN and the recovery clock signal CK0° is greater than the reference phase difference of 0.5 UI.

The first time-to-digital conversion circuit CTDC may operate to reduce a phase difference between the clock of the input signal DIN and the recovery clock signal CK0° within the reference phase difference of 0.5 UI through phase alignment, and may be disabled by the coarse lock signal C_LOCK when a phase difference between the clock of the input signal DIN and the recovery clock signal CK0° is equal to or smaller than the reference phase difference of 0.5 UI.

The second time-to-digital conversion circuit DTDC may be enabled by the coarse lock signal C_LOCK when a phase difference between a clock of the input signal DIN and the recovery clock signal CK0° is equal to or smaller than the reference phase difference of 0.5 UI by the first time-to-digital conversion circuit CTDC.

The second time-to-digital conversion circuit DTDC may receive, from the timing controller, the input signal DIN having data in which a clock has been embedded, and may output the second digital signal DOUT corresponding to a phase difference between a clock of the input signal DIN and the recovery clock signal CK0°.

The second time-to-digital conversion circuit DTDC may be used as a fine loop for aligning a clock of the input signal DIN and the recovery clock signal CK0° so that the clock of the input signal DIN and the recovery clock signal CK0° have a more reduced phase difference within the reference phase difference of 0.5 UI.

The second time-to-digital conversion circuit DTDC may be disabled by the coarse lock signal C_LOCK, or may output the second digital signal DOUT that maintains a previous value when a phase difference between a clock of the input signal DIN and the recovery clock signal CK0° is greater than the reference phase difference of 0.5 UI or the clock is not recognized in the input signal DIN. A case where a clock is not recognized in the input signal DIN may correspond to a case where consecutive data maintains logical "0" and a shift for a clock does not occur.

The second time-to-digital conversion circuit DTDC may receive the recovery clock signal CK0° and the first clock signal CK90° from the digitally controlled oscillator 50, and may output the second digital signal DOUT when a phase difference between a clock of the input signal DIN and the recovery clock signal CK0° is equal to or smaller than a phase difference between the recovery clock signal CK0° and the first clock signal CK90°.

When a phase difference between a clock of the input signal DIN and the recovery clock signal CK0° is greater than a phase difference between the recovery clock signal CK0° and the first clock signal CK90°, the second time-to-digital conversion circuit DTDC may output the second digital signal DOUT that maintains a previous value. This corresponds to a case where the phase difference between the clock of the input signal DIN and the recovery clock signal CK0° is greater than the reference phase difference of 0.5 UI.

The digital loop filter 40 may convert the first digital signal COUT or the second digital signal DOUT into a control signal VCON having an input range in which the digitally controlled oscillator 50 may operate, and may provide the control signal VCON to the digitally controlled oscillator 50.

The digitally controlled oscillator 50 may generate the recovery clock signal CK0°, the first clock signal CK90° and the second clock signal CK270° having different phases by controlling an oscillation frequency and a phase in response to the control signal VCON.

The clock divider 30 may provide the first time-to-digital conversion circuit CTDC with a division clock signal obtained by dividing the recovery clock signal CK0° by a division ratio N. In this case, N is a natural number, and a value of N may be determined depending on a protocol configured between the timing controller and a source driver. The clock divider 30 may raise an output frequency and lower a comparison frequency.

The first time-to-digital conversion circuit CTDC may output the first digital signal COUT corresponding to a phase difference between a clock of the input signal and the division clock signal.

The data recovery unit 120 may sample image data from the input signal DIN by using the first clock signal CK90° and the second clock signal CK270°, and may provide the recovered image data R_DATA to a data driving circuit 130. The data driving circuit 130 may convert the recovered image data R_DATA into a data voltage and provide the data voltage to a display panel.

The data recovery unit 120 may include a sampler 10 and a serial-to-parallel circuit 20.

The sampler 10 may receive the input signal DIN, may sample odd-numbered data DATA_ODD in response to the first clock signal CK90°, and may sample even-numbered data DATA_EVEN in response to the second clock signal CK270°.

The serial-to-parallel circuit 20 may convert serial odd-numbered data DATA_ODD and serial even-numbered data DATA_EVEN into parallel data and output the parallel data as the recovered image data R_DATA in response to the first clock signal CK90° and the second clock signal CK270°, respectively.

The source driver may include the clock and data recovery circuit 100 and the data driving circuit 130.

The source driver may receive, from the timing controller, the input signal DIN having a clock training pattern or having data in which a clock has been embedded.

In this case, the clock and data recovery circuit 100 may recover a clock signal and data from the input signal DIN, and may provide a clock signal and data to the data driving circuit 130.

The data driving circuit 130 may convert image data into a data voltage and provide the data voltage to the display panel.

Figure 2:
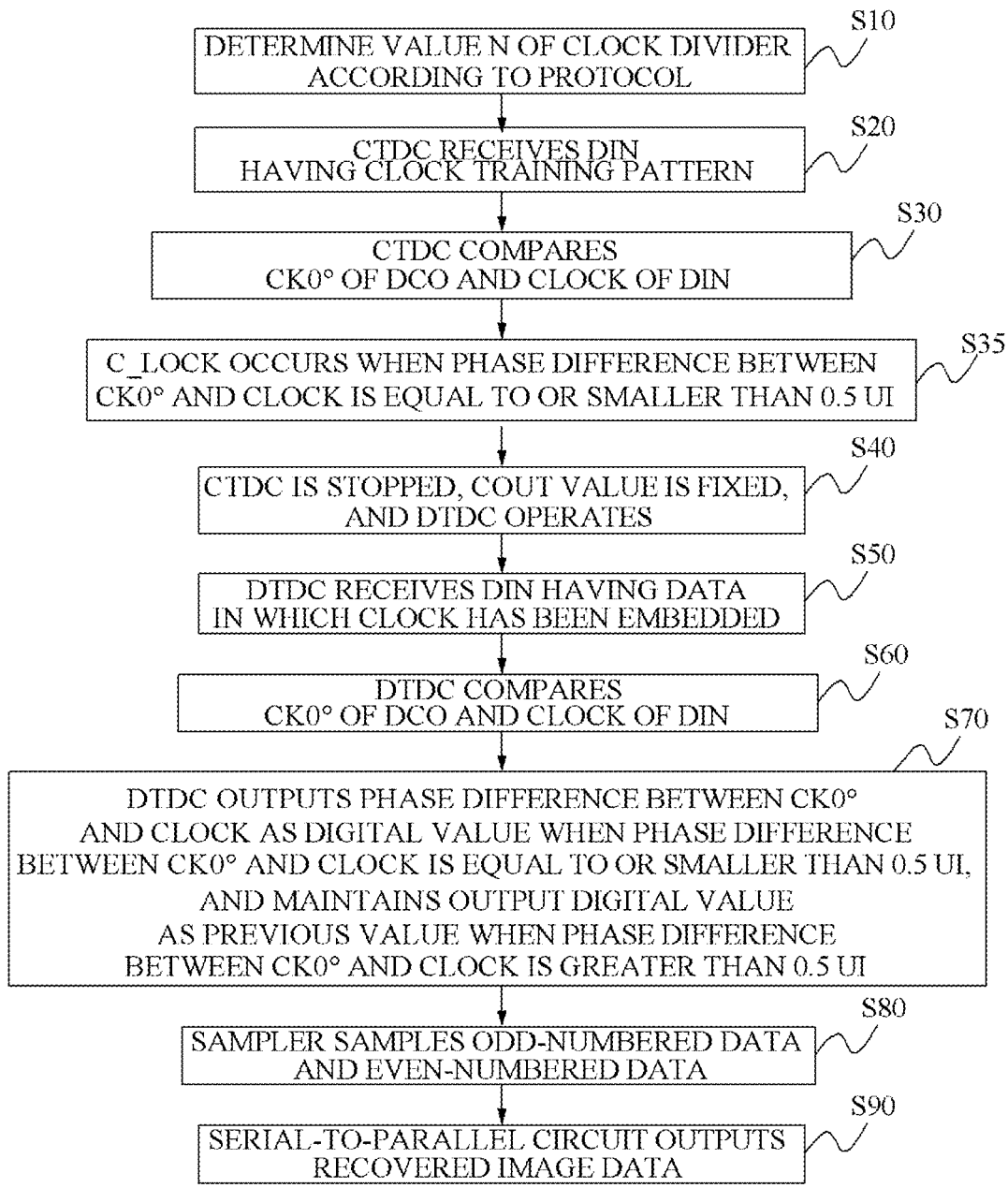
FIG. 2 is a flowchart for describing an operation of the clock and data recovery circuit according to an embodiment.

FIG. 2 is a flowchart for describing an operation of the clock and data recovery circuit 100 according to an embodiment.

First, when power is on, a value of the division ratio N of the clock divider 30 may be determined according to a preset protocol (S10).

The first time-to-digital conversion circuit CTDC may receive the input signal DIN having a clock training pattern in the early stage of an operation (S20).

Furthermore, the recovery clock signal CK0° of the digitally controlled oscillator 50 may be input to the first time-to-digital conversion circuit CTDC (S30). In this case, the recovery clock signal CK0° may be a division clock signal divided by the clock divider 30, and may be input to the first time-to-digital conversion circuit CTDC.

The first time-to-digital conversion circuit CTDC may operate as a coarse loop for phase alignment.

The first time-to-digital conversion circuit CTDC compares a clock of the input signal DIN and the recovery clock signal CK0° input in the form of a division clock signal (S30).

A coarse lock may occur in the first time-to-digital conversion circuit CTDC when a phase difference between the recovery clock signal CK0° and the clock of the input signal DIN is equal to or smaller than the reference phase difference of 0.5 UI (S35). In this case, the occurrence of the coarse lock means the enabling of the coarse lock. A level of the coarse lock signal C_LOCK shifts to a high logic level.

Furthermore, when the coarse lock occurs, the first time-to-digital conversion circuit CTDC may be disabled and an operation thereof may be stopped, and a value of the first digital signal COUT of the first time-to-digital conversion circuit CTDC may be fixed. In conjunction with the operation of the first time-to-digital conversion circuit CTDC, the second time-to-digital conversion circuit DTDC may be enabled and operate (S40).

More specifically, the first time-to-digital conversion circuit CTDC may be disabled when a phase difference between the clock of the input signal DIN and the recovery clock signal CK0° is equal to or smaller than the reference phase difference of 0.5 UI through phase alignment. In this case, the second time-to-digital conversion circuit DTDC may be enabled.

Furthermore, the second time-to-digital conversion circuit DTDC may receive the input signal DIN having data in which a clock has been embedded (S50).

The second time-to-digital conversion circuit DTDC compares a clock of the input signal DIN and the recovery clock signal CK0° (S60).

When a phase difference between the clock of the input signal DIN and the recovery clock signal CK0° is equal to or smaller than the reference phase difference of 0.5 UI, the second time-to-digital conversion circuit DTDC may convert the phase difference into the second digital signal DOUT (S70).

In this case, when the phase difference between the clock of the input signal DIN and the recovery clock signal CK0° is greater than the reference phase difference of 0.5 UI, the second time-to-digital conversion circuit DTDC may output the second digital signal DOUT that maintains a previous value (S70).

Furthermore, when the clock is not recognized in the input signal DIN, the second time-to-digital conversion circuit DTDC may output the second digital signal DOUT that maintains a previous value.

Furthermore, the sampler 10 may sample the odd-numbered data DATA_ODD in response to the first clock signal CK90°, and may sample the even-numbered data DATA_EVEN in response to the second clock signal CK270° (S80).

Furthermore, the serial-to-parallel circuit 20 may convert serial odd-numbered data DATA_ODD and serial even-numbered data DATA_EVEN into parallel data in response to the first clock signal CK90° and the second clock signal CK270°, respectively, and may output the recovered image data R_DATA (S90).

Figure 3:
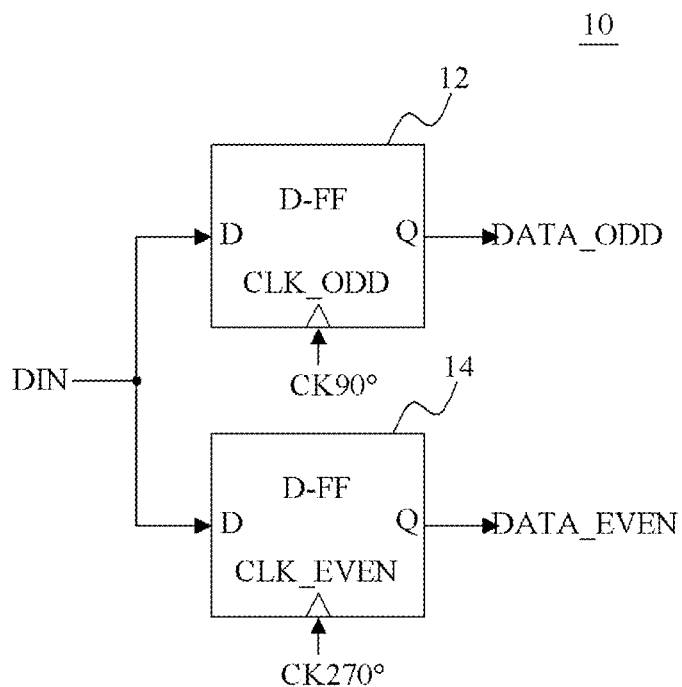
FIG. 3 is a circuit diagram of a sampler illustrated in FIG. 1.

FIG. 3 is a circuit diagram of the sampler 10 illustrated in FIG. 1.

The sampler 10 may include a first D flip-flop (D-FF) 12 and a second D flip-flop (D-FF) 14.

The first D flip-flop 12 may receive the input signal DIN having data in which a clock has been embedded, and may output odd-numbered data DATA_ODD of the input signal DIN in response to the first clock signal CK90°.

The second D flip-flop 14 may receive the input signal DIN having data in which a clock has been embedded, and may output even-numbered data DATA_EVEN of the input signal DIN in response to the second clock signal CK270°.

Figure 4:
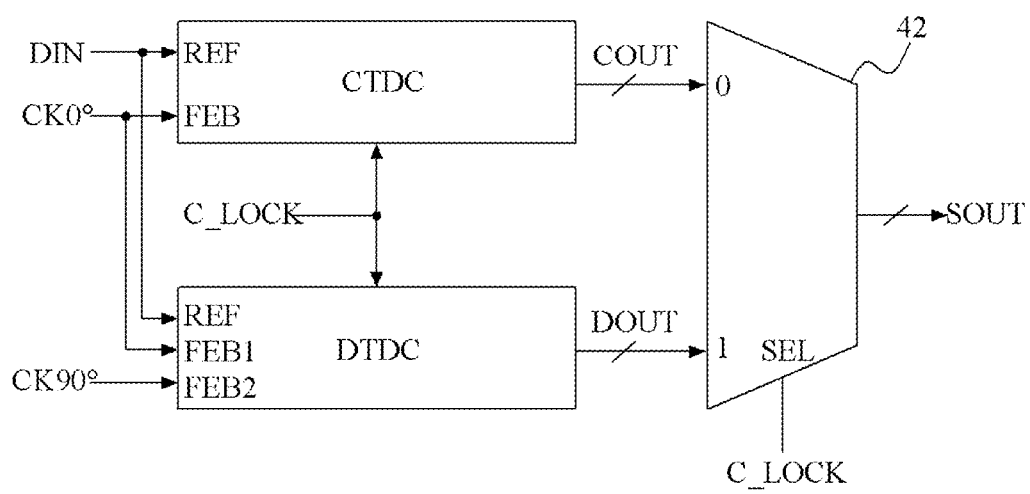
FIG. 4 is a block diagram illustrating an example of a time-to-digital conversion circuit.

FIG. 4 is a block diagram of a time-to-digital conversion circuit 35 for the clock and data recovery circuit 100 according to an embodiment.

The time-to-digital conversion circuit 35 may include the first time-to-digital conversion circuit CTDC, the second time-to-digital conversion circuit DTDC and a multiplexer 42.

Operations of the first time-to-digital conversion circuit CTDC and the second time-to-digital conversion circuit DTDC of FIG. 4 may be understood with reference to FIG. 1, and a detailed description thereof is omitted.

The multiplexer 42 may be configured to select the first digital signal COUT when the coarse lock signal C_LOCK is disabled, to select the second digital signal DOUT when the coarse lock signal C_LOCK is enabled, and to output, as a digital signal SOUT, the selected digital signal to the digital loop filter 40.

The time-to-digital conversion circuit 35 of FIG. 4 is illustrated as including the multiplexer 42. For another example, the multiplexer 42 may be included in the digital loop filter 40 of FIG. 1.

Figure 5:
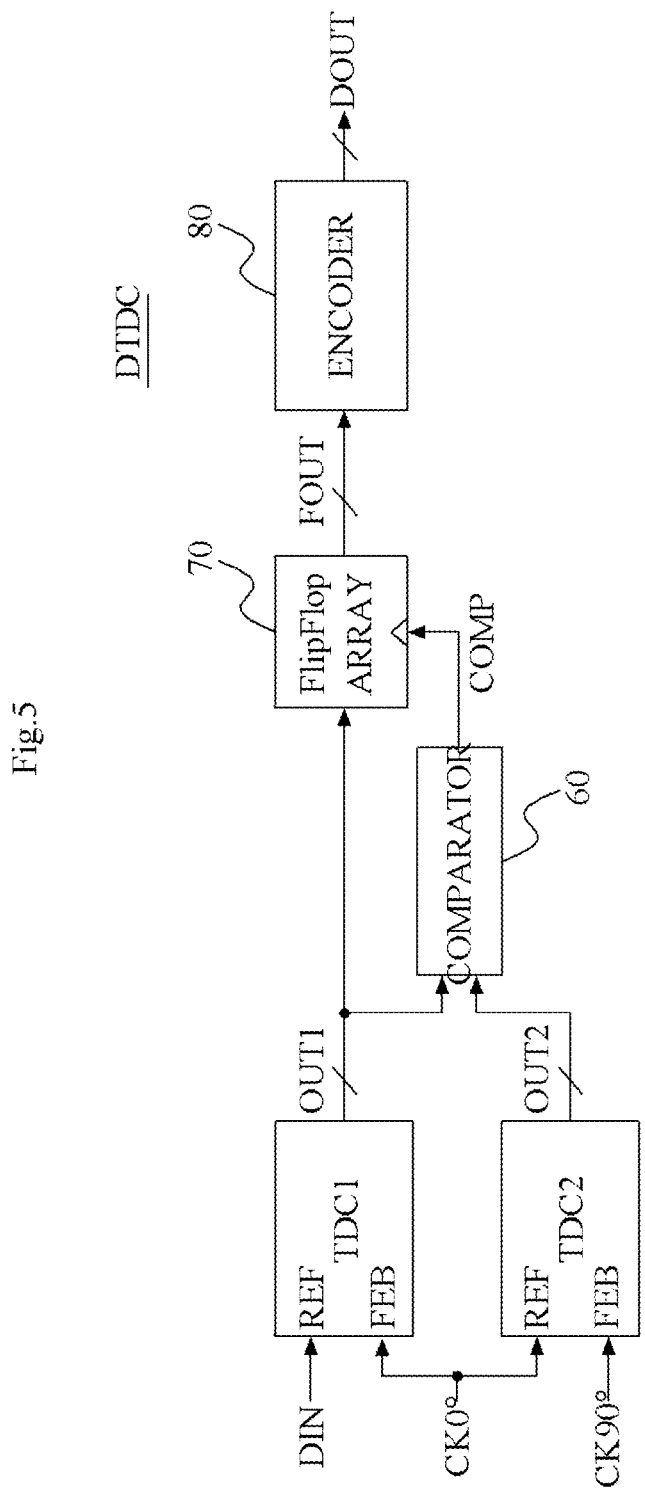
FIG. 5 is a block diagram of a second time-to-digital conversion circuit illustrated in FIG. 4.

FIG. 5 is a block diagram of the second time-to-digital conversion circuit DTDC illustrated in FIG. 4.

The second time-to-digital conversion circuit DTDC may include a first time-to-digital converter TDC1, a second time-to-digital converter TDC2, a comparator 60, a flip-flop array 70 and an encoder 80.

The first time-to-digital converter TDC1 may output a digital value corresponding to a phase difference between a clock of the input signal DIN and the recovery clock signal CK0°, that is, a first output signal OUT1.

The second time-to-digital converter TDC2 may output a digital value corresponding to a phase difference between the recovery clock signal CK0° and the first clock signal CK90°, that is, a second output signal OUT2.

The comparator 60 may compare values of the first output signal OUT1 and the second output signal OUT2, and may output a digital value based on a result of the comparison, that is, a comparison signal COMP.

For example, the comparator 60 may output an enabled comparison signal COMP when a value of the first output signal OUT1, that is, a phase difference between a clock of the input signal DIN and the recovery clock signal CK0° is equal to or smaller than a value of the second output signal OUT2, that is, a phase difference between the recovery clock signal CK0° and the first clock signal CK90°.

The flip-flop array 70 may update and store the first output signal OUT1 in response to the enabled comparison signal COMP, and may output an updated value as a flip-flop signal FOUT in response to a disabled comparison signal COMP or may output the flip-flop signal FOUT that maintains a previous value without an update.

For example, when a value of the first output signal OUT1 is equal to or smaller than a value of the second output signal OUT2, the flip-flop array 70 may output an n-th first output signal OUT1 as an n-th flip-flop signal FOUT in response to the enabled comparison signal COMP.

In contrast, when a value of the first output signal OUT1 is greater than a value of the second output signal OUT2, the flip-flop array 70 may maintain an (n−1)-th first output signal OUT1 and output the (n−1)-th first output signal OUT1 as an n-th flip-flop signal FOUT in response to the disabled comparison signal COMP.

The encoder 80 may convert the flip-flop signal FOUT into the second digital signal DOUT.

As a result, the encoder 80 may convert, into the second digital signal DOUT, the flip-flop signal FOUT corresponding to a phase difference between a clock of the input signal DIN and the recovery clock signal CK0°.

As described above, when a value of the first output signal OUT1 is equal to or smaller than a value of the second output signal OUT2, the second time-to-digital conversion circuit DTDC may convert the first output signal OUT1 into the second digital signal DOUT.

Furthermore, when a value of the first output signal OUT1 is greater than a value of the second output signal OUT2, the second time-to-digital conversion circuit DTDC may output the second digital signal DOUT that maintains a previous value.

For example, when a value of an n-th first output signal OUT1 is greater than a value of the second output signal OUT2, the second time-to-digital conversion circuit DTDC may output an n-th second digital signal DOUT that maintains a value of an (n−1)-th second digital signal DOUT.

Furthermore, when a clock is not recognized in the input signal DIN, the second time-to-digital conversion circuit DTDC may output the second digital signal DOUT that maintains a previous value.

Figure 6:
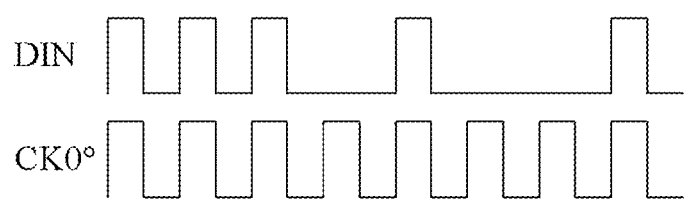
FIG. 6 illustrates a timing diagram of a clock of an input signal and a recovery clock signal.

FIG. 6 illustrates a timing diagram of a clock of the input signal DIN and the recovery clock signal CK0°.

Referring to FIG. 6, a clock of the input signal DIN may be periodically input. Phases of a clock of the input signal DIN and the recovery clock signal CK0° may be aligned through a coarse loop operation of the first time-to-digital conversion circuit CTDC and a fine loop operation of the second time-to-digital conversion circuit DTDC.

In this case, when a clock is not recognized in the input signal DIN, the time-to-digital conversion circuit 35 may maintain a previous value of the second digital signal DOUT so that the coarse loop operation or the fine loop operation is not performed.

For example, when a clock is not recognized in an n-th input signal DIN, the time-to-digital conversion circuit 35 may maintain a value of an n-th second digital signal DOUT as a value of an (n−1)-th second digital signal DOUT.

This is for preventing an output of the digitally controlled oscillator 50 from being changed because an output of the time-to-digital conversion circuit 35 becomes a maximum when a difference between a clock of the input signal DIN and the recovery clock signal CK0° is not determined.

Figure 7:
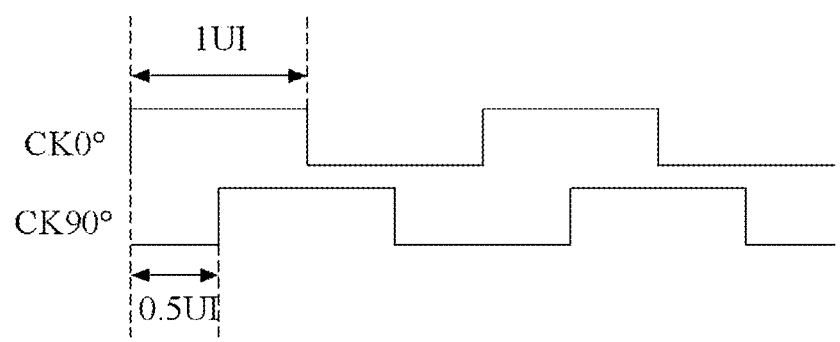
FIG. 7 illustrates a timing diagram of a comparison between phases of a recovery clock signal and a first clock signal having a phase difference of 0.5 UI with respect to the recovery clock signal.

FIG. 7 illustrates a timing diagram of the recovery clock signal CK0° and the first clock signal CK90°.

FIG. 7 illustrates that a phase difference between the recovery clock signal CK0° and the first clock signal CK90° is set as a reference phase difference of 0.5 UI.

The second time-to-digital conversion circuit DTDC may compare a phase difference between a clock of the input signal DIN and the recovery clock signal CK0° and a fixed phase difference between the recovery clock signal CK0° and the first clock signal CK90° as illustrated in FIG. 7.

Figure 8:
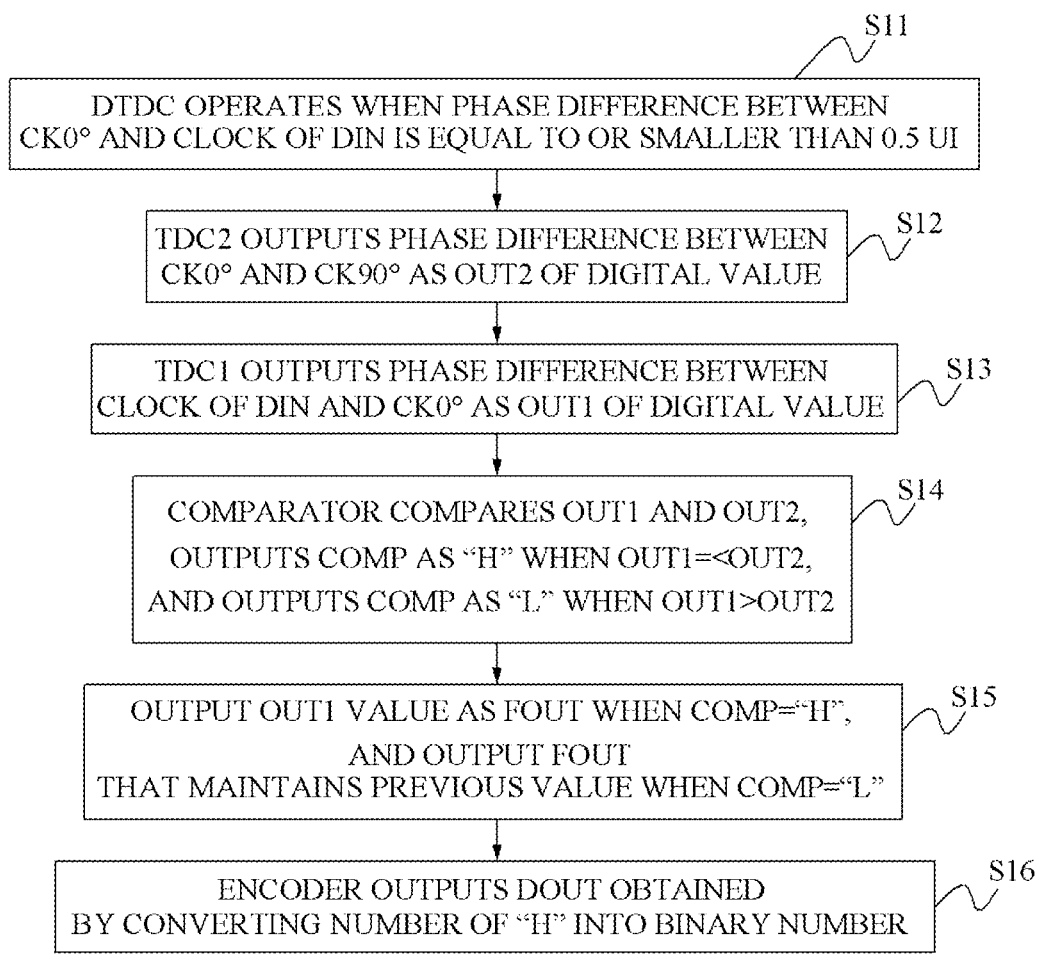
FIG. 8 is a flowchart for describing an operation of the second time-to-digital conversion circuit illustrated in FIG. 5.

FIG. 8 is a flowchart for describing an operation of the time-to-digital conversion circuit 35 of FIG. 5.

Referring to FIG. 8, when a phase difference between a clock of the input signal DIN and the recovery clock signal CK0° is equal to or smaller than the reference phase difference of 0.5 UI, the second time-to-digital conversion circuit DTDC may operate (S11).

The second time-to-digital converter TDC2 may convert, into a digital value, the reference phase difference of 0.5 UI corresponding to a phase difference between the recovery clock signal CK0° and the first clock signal CK90°, and may output the digital value as the second output signal OUT2 (S12).

The first time-to-digital converter TDC1 may convert, into a digital value, a phase difference between a clock of the input signal DIN and the recovery clock signal CK0°, and may output the digital value as the first output signal OUT1 (S13).

The comparator 60 may compare values of the first output signal OUT1 and the second output signal OUT2, and may output the comparison signal COMP based on a result of the comparison (S14).

When the value of the first output signal OUT1 is equal to or smaller than the value of the second output signal OUT2, the comparator 60 may output the comparison signal COMP in an enable state, that is, at a high logic level. When the value of the first output signal OUT1 is greater than the value of the second output signal OUT2, the comparator 60 may output the comparison signal COMP in a disable state, that is, at a low logic level.

The flip-flop array 70 may update the first output signal OUT1 and output an updated value as the flip-flop signal FOUT or may output the flip-flop signal FOUT that maintains a previous value, in response to the comparison signal COMP (S15).

The encoder 80 may output the second digital signal DOUT obtained by converting the number of "H" in the flip-flop signal FOUT into a binary number (S16).

As a result, the encoder 80 may convert a phase difference between a clock of the input signal DIN and the recovery clock signal CK0° into the second digital signal DOUT.

Figure 9:
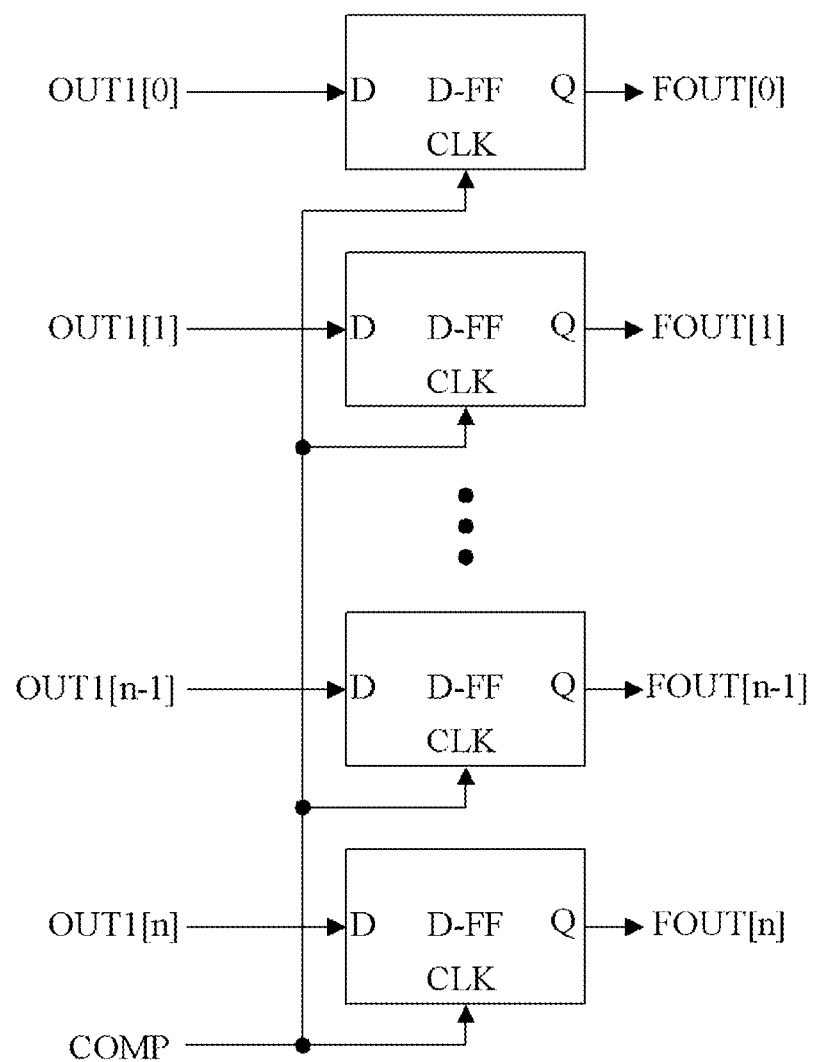
FIG. 9 is a circuit diagram of a flip-flop array illustrated in FIG. 5.

FIG. 9 is a circuit diagram of the flip-flop array 70 illustrated in FIG. 5.

The flip-flop array 70 may include D flip-flops D-FF corresponding to an output signal OUT1[0] to an output signal OUT1[n], respectively.

The D flip-flops D-FF may update the output signals OUT1[0] to OUT1[n] and output updated flip-flop signals FOUT or may output the flip-flop signals FOUT that maintain previous values, respectively, in response to the comparison signal COMP. When a value of the first output signal OUT1 is equal to or smaller than a value of the second output signal OUT2, a level of the comparison signal COMP may be input as a high logic level, so that the updates of the D flip-flops D-FF and the outputs of the flip-flop signals FOUT may be controlled. Furthermore, when a value of the first output signal OUT1 is greater than a value of the second output signal OUT2, a level of the comparison signal COMP may be input as a low logic level, so that the maintenance of previous values of the D flip-flops D-FF and the outputs of the flip-flop signals FOUT may be controlled.

Figure 10:
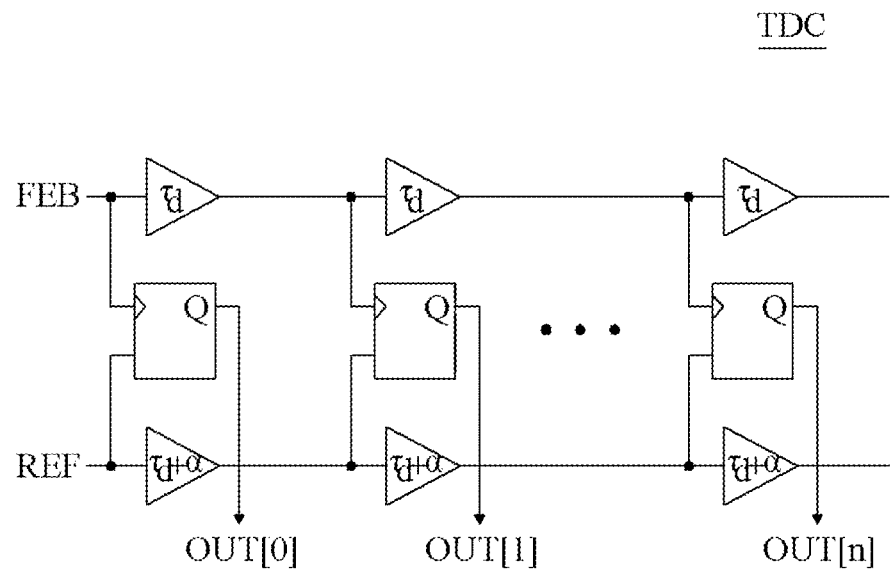
FIG. 10 is a circuit diagram illustrating a time-to-digital converter.

FIG. 10 is a circuit diagram of a time-to-digital converter TDC.

Referring to FIG. 10, the time-to-digital converter TDC may output output signals OUT[0] to OUT[n] corresponding to phase differences among signals, respectively, which are input to a reference terminal REF and a feedback terminal FEB.

For example, the time-to-digital converter TDC may output the output signals OUT[0] to OUT[n] as "HHHLLLLL . . . " or "LLLHHHHH . . . " according to which signal has an earlier phase among the signals input to the reference terminal REF and the feedback terminal FEB.

In this case, the number of "H" may be determined as "HHHLLLLL . . . " in which H is sequentially positioned from the least significant bit (LSB). The encoder 80 may convert, into a binary number, bits corresponding to the number of "H."

As described above, according to the present embodiments, a clock and data can be easily recovered even in an operation of transmitting data at a high speed because the time-to-digital conversion circuit capable of comparing data and a clock signal is used.

Furthermore, according to embodiments, a circuit can be simplified and scalability for a process change can be facilitated because the circuit is implemented as a digital circuit.

Furthermore, according to embodiments, a clock embedded in data can be recovered because a clock signal and data can be compared although a location of the clock is changed depending on a protocol.

What is claimed is:

1. A time-to-digital conversion circuit comprising:
   a first time-to-digital conversion circuit enabled when a first phase difference between a clock of an input signal and a recovery clock signal is greater than a reference phase difference and configured to output a first digital signal corresponding to the first phase difference; and
   a second time-to-digital conversion circuit enabled when the first phase difference is equal to or smaller than the reference phase difference and configured to output a second digital signal corresponding to the first phase difference.

2. The time-to-digital conversion circuit of claim 1, wherein the second time-to-digital conversion circuit comprises:
   a first time-to-digital converter configured to output a first output signal corresponding to the first phase difference; and
   a second time-to-digital converter configured to output a second output signal corresponding to a second phase difference between the recovery clock signal and a first clock signal,
   wherein the first clock signal has the preset second phase difference from the recovery clock signal.

3. The time-to-digital conversion circuit of claim 2, wherein the second phase difference is set identically with the reference phase difference.

4. The time-to-digital conversion circuit of claim 2, wherein the second time-to-digital conversion circuit converts the first output signal into the second digital signal when a value of the first output signal is equal to or smaller than a value of the second output signal.

5. The time-to-digital conversion circuit of claim 2, wherein the second time-to-digital conversion circuit further comprises:
   a comparator configured to compare the first output signal and the second output signal and output a comparison signal based on a result of the comparison;
   a flip-flop array configured to update the first output signal and output the updated signal as a flip-flop signal in response to an enabled comparison signal and to output the flip-flop signal that maintains a previous value in response to a disabled comparison signal; and
   an encoder configured to convert the flip-flop signal into the second digital signal.

6. The time-to-digital conversion circuit of claim 2, wherein the second time-to-digital conversion circuit outputs the second digital signal that maintains a previous value when a value of the first output signal is greater than a value of the second output signal.

7. The time-to-digital conversion circuit of claim 1, wherein the second time-to-digital conversion circuit outputs the second digital signal that maintains a previous value when the clock of the input signal is not recognized.

8. The time-to-digital conversion circuit of claim 1, further comprising a multiplexer configured to select one of the first digital signal and the second digital signal and output the selected signal, in response to a coarse lock signal enabled or disabled depending on whether the first phase difference is equal to or smaller than the reference phase difference.

9. The time-to-digital conversion circuit of claim 8, wherein the multiplexer selects the first digital signal when the first phase difference is greater than the reference phase difference and selects the second digital signal when the phase difference is equal to or smaller than the reference phase difference.

10. A source driver comprising:
    a clock and data recovery circuit configured to generate a recovery clock signal and recovery data from an input signal by using a time-to-digital conversion circuit; and
    a data driving circuit configured to convert the recovery data into a data voltage and provide the data voltage to a display panel,
    wherein the time-to-digital conversion circuit comprises:
    a first time-to-digital conversion circuit enabled when a first phase difference between a clock of the input signal and the recovery clock signal is greater than a reference phase difference and configured to output a first digital signal corresponding to the first phase difference; and
    a second time-to-digital conversion circuit enabled when the first phase difference is equal to or smaller than the reference phase difference and configured to output a second digital signal corresponding to the first phase difference.

11. The source driver of claim 10, wherein the second time-to-digital conversion circuit comprises:
    a first time-to-digital converter configured to output a first output signal corresponding to the first phase difference; and
    a second time-to-digital converter configured to output a second output signal corresponding to a second phase difference between the recovery clock signal and a first clock signal,
    wherein the first clock signal has the second phase difference from the recovery clock signal.

12. The source driver of claim 11, wherein the second phase difference is set identically with the reference phase difference.

13. The source driver of claim 11, wherein the second time-to-digital conversion circuit converts the first output signal into the second digital signal when a value of the first output signal is equal to or smaller than a value of the second output signal.

14. The source driver of claim 11, wherein the second time-to-digital conversion circuit further comprises:
    a comparator configured to compare the first output signal and the second output signal and output a comparison signal based on a result of the comparison;
    a flip-flop array configured to update the first output signal and output the updated signal as a flip-flop signal in response to an enabled comparison signal and to output the flip-flop signal that maintains a previous value in response to a disabled comparison signal; and an encoder configured to convert the flip-flop signal into the second digital signal and output the second digital signal to a digital loop filter.

15. The source driver of claim 11, wherein the second time-to-digital conversion circuit outputs the second digital signal that maintains a previous value when a value of the first output signal is greater than a value of the second output signal.

16. The source driver of claim 10, wherein the second time-to-digital conversion circuit outputs the second digital signal that maintains a previous value when the clock of the input signal is not recognized.

17. The source driver of claim 10, further comprising a multiplexer configured to select one of the first digital signal and the second digital signal and output the selected signal, in response to a coarse lock signal enabled or disabled depending on whether the first phase difference is equal to or smaller than the reference phase difference.

18. The source driver of claim 17, wherein the multiplexer selects the first digital signal when the first phase difference is greater than the reference phase difference and selects the second digital signal when the first phase difference is equal to or smaller than the reference phase difference.

* * * * *